(12) United States Patent
Gotoh et al.

(10) Patent No.: US 6,189,760 B1
(45) Date of Patent: Feb. 20, 2001

(54) CHIP JUNCTION NOZZLE

(75) Inventors: Masashi Gotoh; Jitsuo Kanazawa; Koichiro Okazaki; Toru Mizuno; Yoshihiro Onozeki, all of Tokyo (JP)

(73) Assignee: TDK Corporation, Tokyo (JP)

( * ) Notice: Under 35 U.S.C. 154(b), the term of this patent shall be extended for 0 days.

(21) Appl. No.: 09/460,109

(22) Filed: Dec. 13, 1999

(30) Foreign Application Priority Data

Dec. 14, 1998 (JP) .................................................. 10-375314

(51) Int. Cl.$^7$ ............................... B23K 1/06; B23K 37/04
(52) U.S. Cl. .................. 228/1.1; 228/110.1; 228/49.1; 228/49.5
(58) Field of Search ................................ 228/1.1, 110.1, 228/180.22, 44.7, 49.1, 49.5

(56) References Cited

U.S. PATENT DOCUMENTS 3,575,333 * 4/1971 Kulicke et al. .
4,628,584 * 12/1986 Clark et al. .
4,667,870 * 5/1987 Avedissian et al. .
6,001,180 * 12/1999 Inoue .

FOREIGN PATENT DOCUMENTS

| 59-208844 | 11/1984 | (JP) . |
| 4-216641 | 8/1992 | (JP) . |
| 7-58155 | 3/1995 | (JP) . |
| 7-115109 | 5/1995 | (JP) . |

* cited by examiner

*Primary Examiner*—Patrick Ryan
*Assistant Examiner*—Jonathan Johnson
(74) *Attorney, Agent, or Firm*—Oblon, Spivak, McClelland, Maier & Neustadt, P.C.

(57) ABSTRACT

A chip junction nozzle in that opposite slant planes 43 which come into contact with edges of 2 sides of the chip in parallel centering around a nozzle center, and a vacuum suction hole 42 opened in the nozzle center are provided, and the slant plane 43 is formed into a mirror surface having the surface hardness more than HrC40. Further, when the surface roughness of the mirror surface is expressed by the average roughness of the center line, the average roughness of the center line is not more than 1.6 μm.

8 Claims, 13 Drawing Sheets

FIG.7
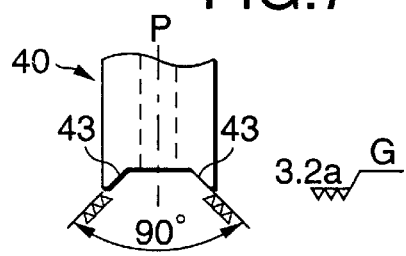
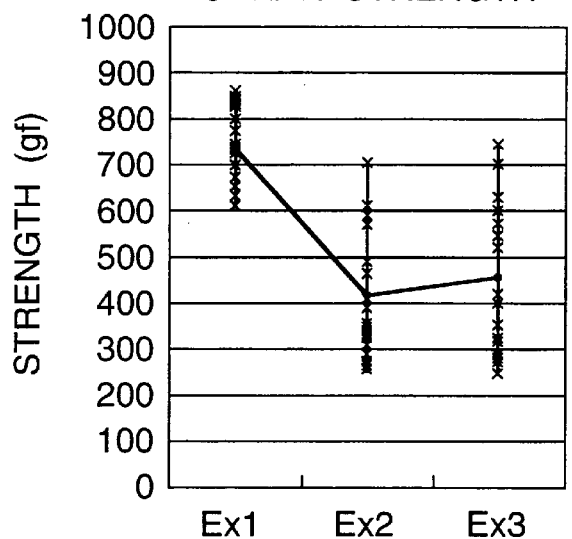
FIG.8
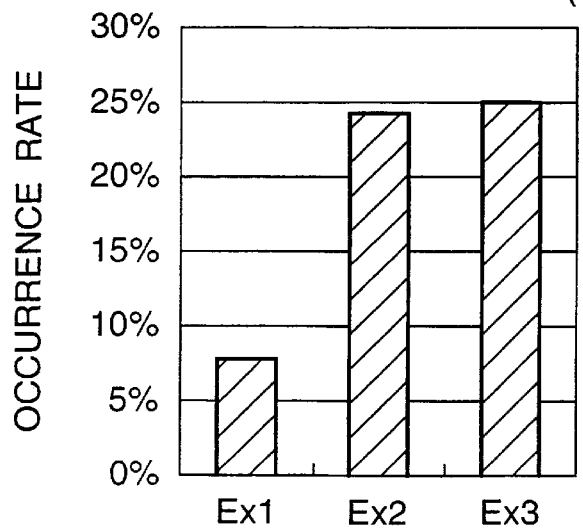

SHEAR STRENGTH

CRAZING AND CRACKING OCCURRENCE RATE
(BUMP UNIT)

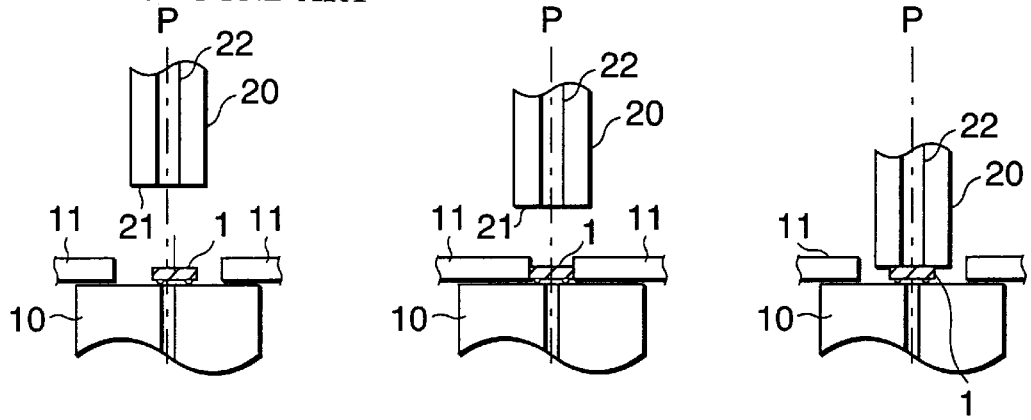
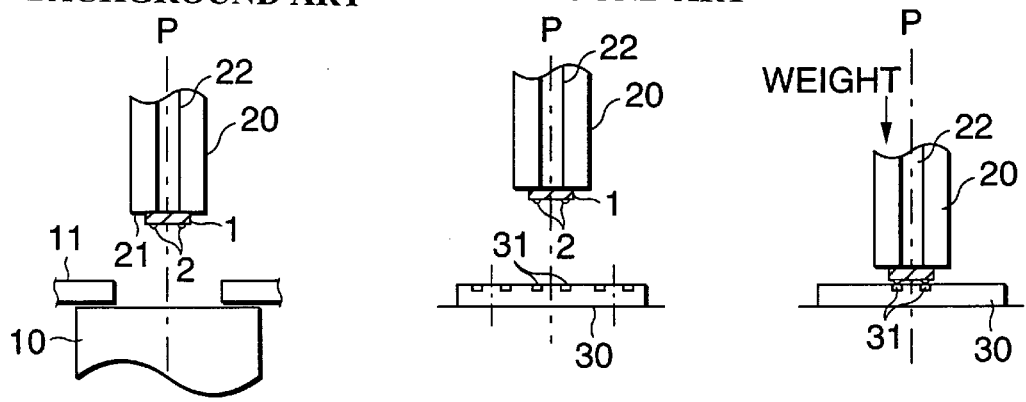
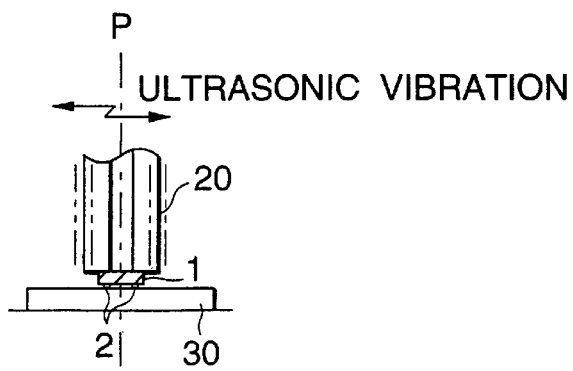

CHIP JUNCTION NOZZLE

BACKGROUND OF THE INVENTION

The present invention relates to a chip junction nozzle by which, when semiconductor circuit elements, or the like, are produced, a chip of the semiconductor, SAW element, and the similar element, is taken out of a supply apparatus and is jointed onto a printed circuit board by high frequency bonding, or the like.

Conventionally, when semiconductor circuit elements, or the like, are produced, a structural means and a method by which a chip is taken out of the supply apparatus and is jointed onto the printed circuit board, will be described below. Incidentally, the chip of the object is one used as face down mounting by a flip chip method.

A chip of the semiconductors, SAW elements, and the like, prepared in the supply apparatus is individually taken out, and the chip is moved to a temporary placement base by a moving nozzle provided with a means which can move the chip in the X, Y, Z directions. In this case, when the chip prepared in the supply apparatus is a face-up one, the chip is flipped such that the chip assumes a face down posture between the moving means and the movement process, and when the chip is a face down one, only the movement is conducted.

The chip 1 is moved to the temporary placement board 10 as shown in FIG. 20(A). Then, the position of the chip 1 is corrected as shown in FIG. 20(B) by four centering claws 11, in which respective one of the front and rear, and left and right, settled on the temporary placement base, is moved. Then, as shown in FIG. 20(C), the chip 1 on the temporary placement base 10 is picked up as shown in FIG. 20(D) by using a chip junction nozzle 20 which is fixed on a vibration apparatus which is provided with moving means in the X, Y, Z directions, other than the moving nozzle, and which generates ultrasonic, moved, and is positioned on the upper portion of a target position of a printed circuit board 30 to be jointed as shown in FIG. 20(E). From this situation, the chip junction nozzle 20 is lowered as shown in FIG. 20(F) to a position in which a bump (conductor metals) 2 formed on the surface of the chip 1 placed on the lower leading edge of the junction nozzle 20, comes into contact with a conductor pattern (conductor metals) 31 on the printed circuit board 30, and applies a pressure onto the chip 1 as shown in FIG. 20(G), and junction is conducted by generating the ultrasonic on the leading edge of the chip junction nozzle 20. For example, as a typical junction method, there is a GGI (Gold to Gold Interconnection), or the like. Further, as a junction method for another facedown mounting, there are a method by heating, a method by heating and pressure, a method in which a special junction medium is inserted between the chip and the printed circuit board, or similar method.

The apparatus to joint by using ultrasonic vibration as described above is also proposed in Japanese Patent Publication 59-208844. However, the recessed portion of the nozzle is considered as conical.

Incidentally, as shown in FIG. 20, conventionally, in a general chip junction nozzle 20, its lower end surface 21 to pick up the chip 1 is a simple flat surface, and a vacuum suction hole 22 is formed in the nozzle center. In the chip junction using such the chip junction nozzle 20, it is difficult that parallelism of the surface of the chip 1 to be jointed, or that of the height of bump 2 formed on the surface of the chip, to the surface of the pattern 31 of the printed circuit board 30 to be jointed, is vary accurately obtained. Particularly, due to recent increase of the number of bumps of the chip, and an increase of fineness, because the degree of margin of the deformation of the bump itself accompanied by the junction becomes small, a small deviation in the parallelism between a peak of the bump 2 and the printed circuit board 30 becomes also a problem. For example, as shown in FIG. 21, when the chip 1 is pressed by using the junction nozzle 20 in the situation that the inclination is several $\mu$m (inclination=h1−h2), chipping or crack of the chip 1 is generated by uniformity of the weighted stress at the junction, or further, in the junction by the generation of the ultrasonic just after, the strength necessary for the junction is not obtained due to unevenness of the strength of the jointed portion, or so. Particularly, the junction failure due to the inclination of the chip 1 and the printed circuit board 30 is frequently happened when these are parallel to the direction of vibration to generate the ultrasonic (the case shown in FIG. 21).

The conventional chip junction nozzle 20 is operated such that the chip 1 to be jointed is sucked by negative pressure, and the chip is closely adhered to the lower end surface 21 of the chip junction nozzle. Accordingly, heats conducted from the substrate during chip junction or heats generated by the ultrasonic vibration can not be radiated and the temperature of the chip rises, and there is a possibility that nonconformity occurs in the chip.

SUMMARY OF THE INVENTION

In view of the above described points, the object of the present invention is to provide a chip junction nozzle by which the junction can be always conducted in the situation of parallel to the pattern of the printed circuit board to be jointed, and the chip can be mounted with uniform and strong junction strength.

In order to attain the above object, the chip junction nozzle of the present invention comprises: opposite slopes contacting in parallel to edges of two sides of the chip centering around the nozzle center; and a vacuum suction hole opened at the nozzle center, and in that the slope is formed into a mirror surface.

According to such the structure, in the process in which the chip junction nozzle picks up the chip, and the chip is placed on the printed circuit board, the surface in the lower direction of the chip, or the height of the peak of each conductor metals which is called a bump, is position-corrected such that these are parallel to the upper surface of the printed circuit board, and further, the surface of the chip to be jointed or the height of the peak of each conductor metals, and the surface of the printed circuit board pattern can come into contact with each other while these are always keeping parallelism, can be pressed, and the junction by the ultrasonic can be conducted.

In the chip junction nozzle, the hardness of the surface of the mirror surface is preferably not less than HrC 40.

When the surface roughness of the mirror surface is expressed by the average roughness of the centerline, the average roughness of the centerline is preferably not more than 1.6 $\mu$m.

The slope is preferably a plane or a circular arc surface.

BRIEF DESCRIPTION OF THE DRAWINGS

FIG. 7 is a graph showing the junction strength (shear strength) of a bump for each of product examples (1), (2) and (3) when the fineness of a slant plane of the chip junction nozzle does not reach a mirror surface but a slightly coarse surface;

FIG. 8 is a graph showing a generation rate of crazing and cracking for each bump unit for each of product examples (1), (2) and (3) when the fineness of a slant plane of the chip junction nozzle does not reach a mirror surface but a slightly coarse surface;

FIGS. 20(A) to 20(G) are illustration showing a chip mounting operation by the conventional chip junction nozzle;

DETAILED DESCRIPTION OF THE PREFERRED EMBODIMENTS

Figure 1:
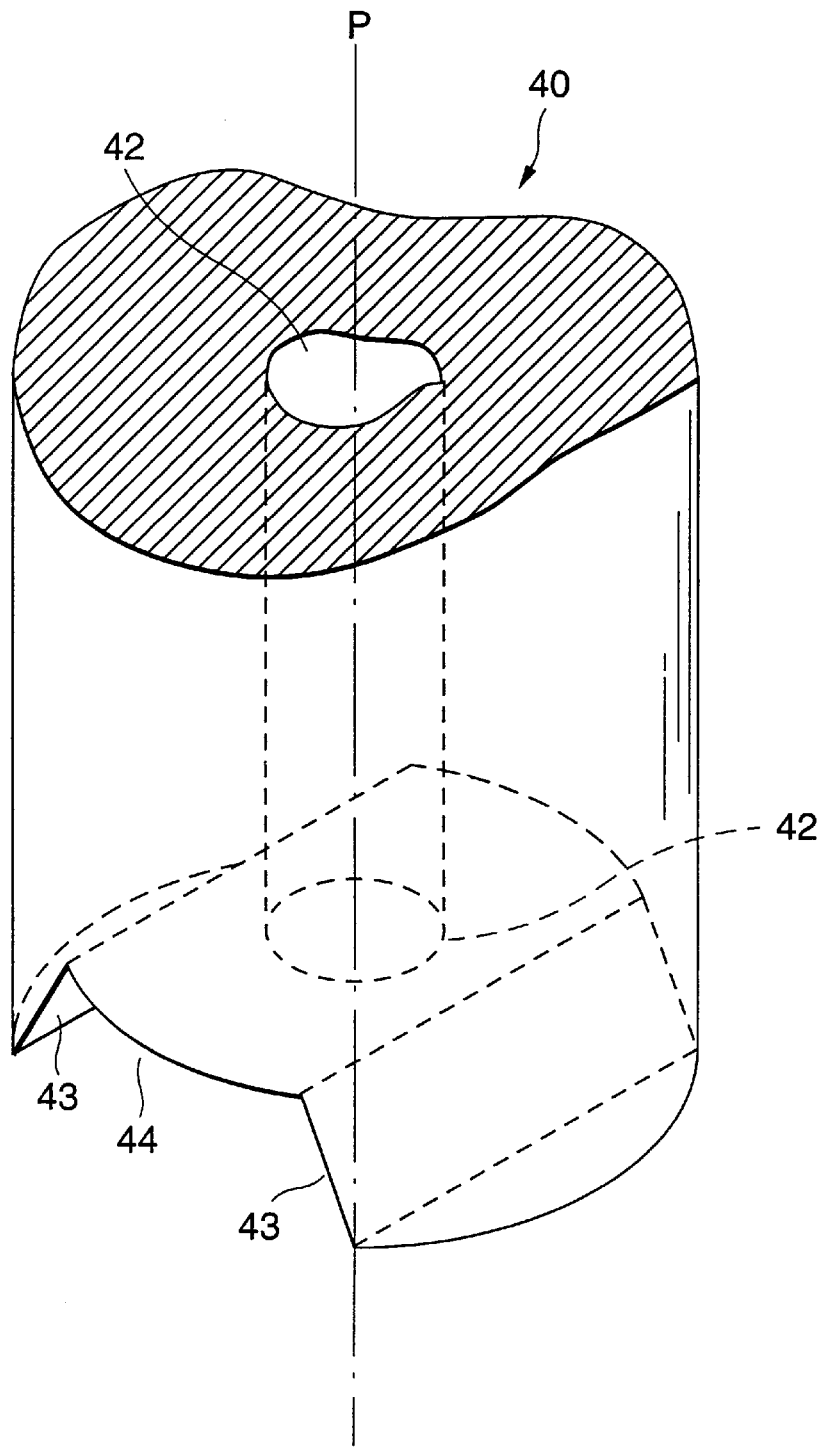
FIG. 1 is a perspective view showing the first embodiment of a chip junction nozzle according to the present invention.
Figure 2:
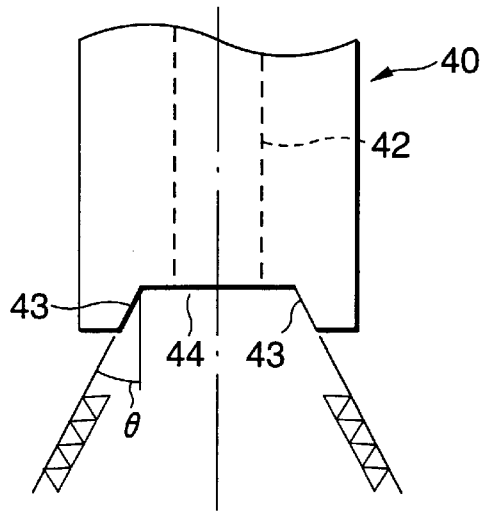
FIG. 2 is a front view showing the first embodiment of a chip junction nozzle according to the present invention.
Figure 3:
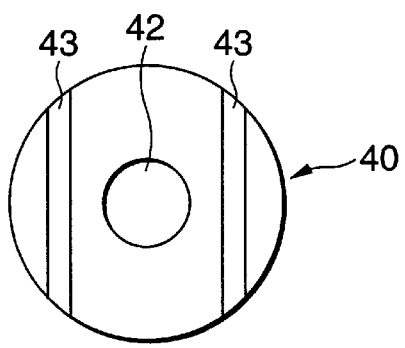
FIG. 3 is a bottom view showing the first embodiment of a chip junction nozzle according to the present invention.
Figure 4:
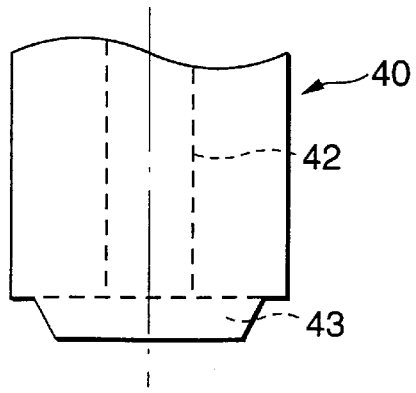
FIG. 4 is a side view showing the first embodiment of a chip junction nozzle according to the present invention.

Referring to the drawings, the embodiments of the chip junction nozzle according to the present invention will be described below.

Referring to FIG. 1 through FIG. 4, a leading edge structure of the chip junction nozzle according to the first embodiment of the present invention will be described. As shown in these drawings, the chip junction nozzle 40 has opposite slant planes 43 contacting in parallel to edges of two sides the chip centering around the nozzle center, and as the result, a recessed portion 44 into which the upper portion of the chip partially enters, is formed on the leading edge surface of the nozzle. A vacuum suction hole 42 is opened at the nozzle center, that is, at the central position of the recessed portion 44. The slant plane 43 is formed into a mirror surface, and preferably when the surface roughness of the mirror surface is expressed by the average roughness of the centerline, the average roughness of the centerline is set to not more than 1.6 μm. Further, the material of the chip junction nozzle 40 is carbon steel or the like, and preferably, DLC (diamond like carbon) processing is subjected as the surface treatment. Incidentally, the inclination angle θ of the slant plane 43 to the nozzle center axis P is $30° \leq \theta \leq 60°$, and for example, set to 45°.

The surface hardness of the mirror surface of the chip junction nozzle may be more than HrC40, and the surface treatment is not limited to the DLC processing, but the surface treatment which forms a film layer such as TiC or TiN on the surface, may be allowable. Further, the material in which the material itself of the nozzle has the hardness more than HrC40, may also be used, or the surface hardness may also be made more than HrC40 by heat-treating the carbon steel or the like.

In FIG. 5, mounting operations of the face down chip to the printed circuit board, using the chip junction nozzle 40 of the first embodiment will be shown.

Figure 5A:
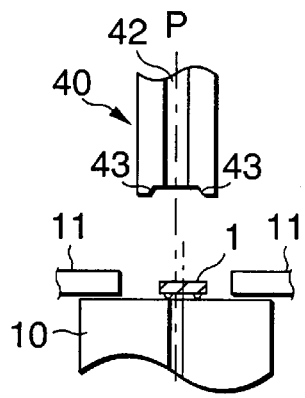
FIGS. 5(A) to 5(G) are illustration showing a chip mounting operation by the chip junction nozzle shown in the first embodiment.
Figure 5B:
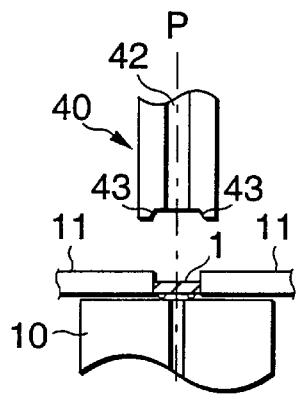
Figure 5C:
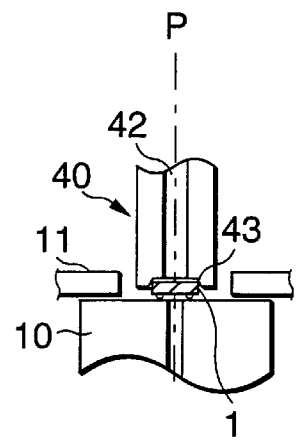

As shown in FIG. 5(A), initially, the chip 1 to be jointed is placed on the temporary placement board 10. Next, as shown in FIG. 5(B), the position of the chip 1 is adjusted by the 4 claws 11 for centering in the front and rear, and the left and right directions on the temporary placement board 10 such that the center of the chip 1 coincides with the center of the chip junction nozzle 40. The chip junction nozzle 40 is provided with moving means in the X, Y, Z directions, and further, is fixed to the vibration apparatus which generates ultrasonic, and the shape of the leading edge of the junction nozzle 40 has, as shown in FIG. 1 through FIG. 4, opposite slant planes 43 contacting in parallel to edges of 2 sides of the chip 1 centering around the nozzle center, and the slant plane 43 is surface-processed to the mirror surface so that the wear with the edge of the chip 1 can be as small as possible, and further, it is DLC surface-processed. After that, as shown in FIG. 5(C), the junction nozzle 40 is lowered to a position at which it comes into contact with edges of 2 sides of the upper surface of the chip, and the chip 1 is sucked and held by the vacuum suction force generated on the leading edge of the nozzle. In this pick-up process, the edge of the chip slides on the slant plane 43, thereby, even when the nozzle center axis P of the junction nozzle 40 is not vertical to the chip placement surface of the temporary placement board 10, the junction nozzle 40 can suck and hold the chip 1 in the parallel situation to the chip placement surface.

Figure 5D:
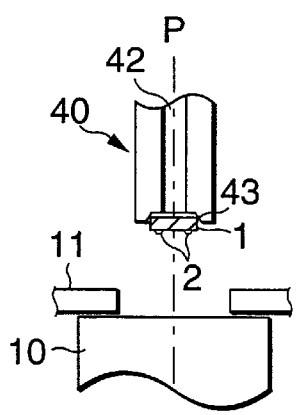
Figure 5E:
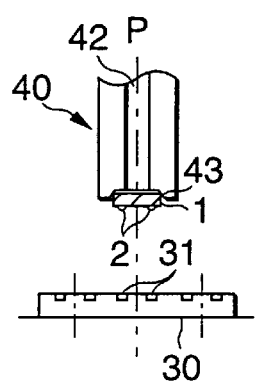

After that, the chip 1 sucked and held by the junction nozzle 40 as shown in FIG. 5(D) is moved upward, and is moved to a target position on the printed circuit board 30 to be jointed as shown in FIG. 5(E).

Figure 5F:
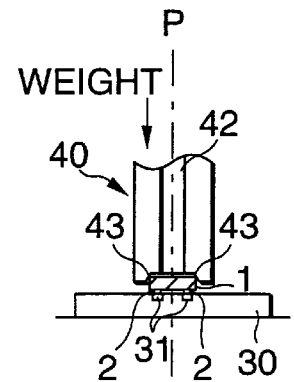
Figure 5G:
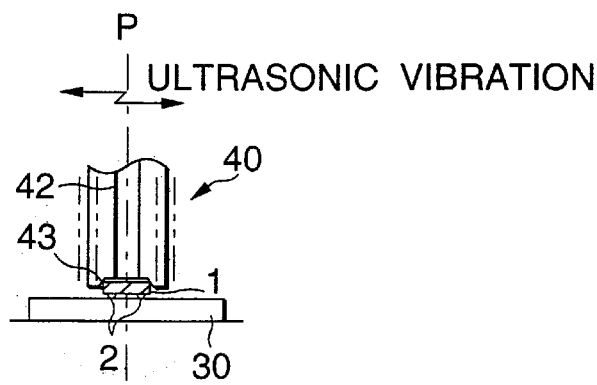

Next, as shown in FIG. 5(F), the junction nozzle 40 is lowered to a position at which the height of the peak of each bump 2 on the chip surface comes into contact with the pattern 31 on the print board 30, and further, the chip 1 is pressed from above. In this case, the slant plane 43 of the junction nozzle 40 comes into contact with edges of 2 sides of the chip 1 and slides, and urges the movement in which the posture of the chip 1 is kept to be parallel to the junction surface of the printed circuit board 30. When the chip placement surface of the temporary placement board 10 is perfectly parallel to the junction surface of the printed circuit board 30, the peak of each bump 2 of the chip 1 should uniformly come into contact with the junction surface of the printed circuit board 30. However, according to this junction nozzle 40, even if there is a deviation in the parallelism between the chip placement surface of the temporary placement board 10 and the junction surface of the printed circuit board 30, a parallel is kept between the chip 1 to joint and the printed circuit board 30 to be jointed, and as shown in FIG. 5(G), when the ultrasonic vibration is applied onto the chip 1 through the junction nozzle 40, the junction in which respective bumps 2 and the pattern junction surface have uniform junction strength, can be obtained.

Figure 6:
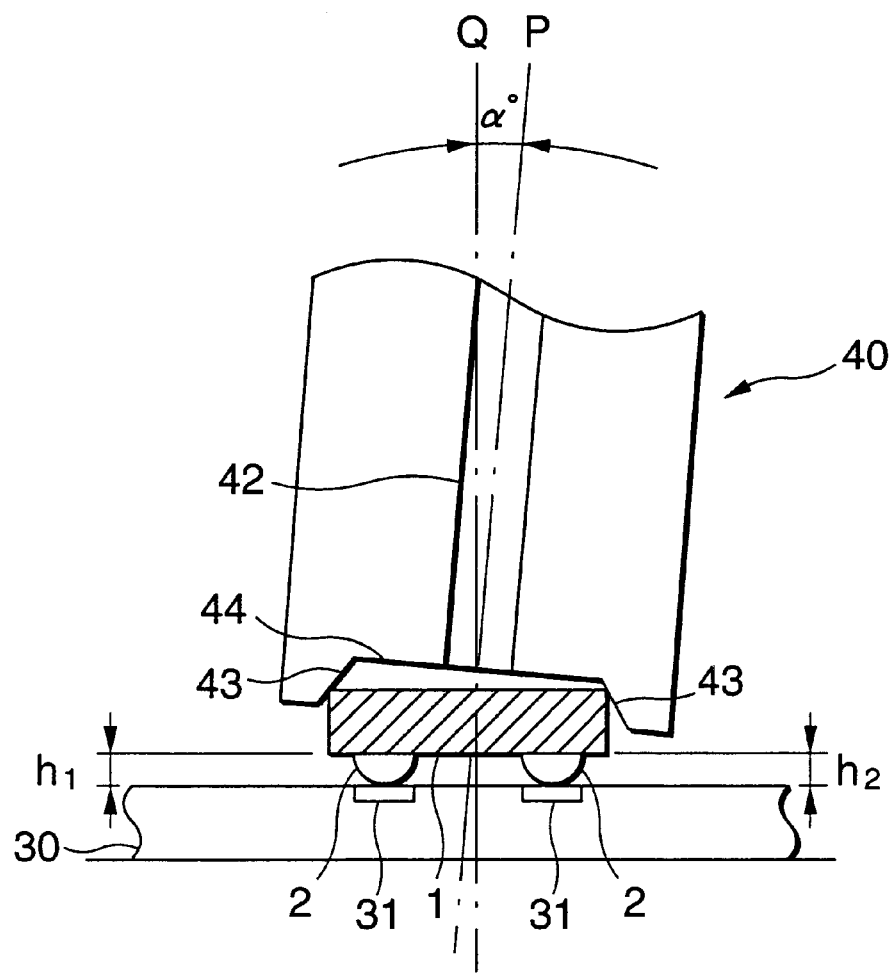
FIG. 6 is a front sectional view explaining the mounting operation when there is a slight deviation between a perpendicular of the pattern surface of a printed circuit board and a nozzle center axis of the chip junction nozzle.

FIG. 6 shows the operation of chip junction nozzle 40 when there is a slight inclination $\alpha°$ between the nozzle center axis P of the chip junction nozzle 40 and the perpendicular Q to the junction surface having the pattern 31 of the printed circuit board 30, and because the slant surface 43 of the junction nozzle 40 is a small wear mirror surface and hard surface, even when it comes into contact with edges of 2 sides of the chip 1, it can smoothly slide, and the gaps h1 and h2 between the left and right of the chip and the junction surface of the board are same, that is, it can be seen that a parallel between the chip 1 and the junction surface of the board is kept such that h1−h2=0.

FIG. 7 through FIG. 10 show how the junction strength of bump (herein, shear strength is measured) and the generation rate of crazing and cracking for each unit of bump change when the slant plane 43 of the chip junction nozzle 40 is not formed into a mirror surface but a little rough surface, and when it is mirror-processed.

In FIG. 7 and FIG. 8, the nozzle 40 in which the slant plane 43 of the inclined angle 45°, which is symmetrical to the nozzle center axis P, is formed by the cutting work by a grinder, is used, and when the surface roughness is expressed by the average roughness of the center line, the average roughness of the center line is about 3.2 $\mu$m. FIG. 7 shows the shear strength, and FIG. 8 shows the generation rate of crazing and cracking for each unit of bump. Further, 20 measuring samples for each of product examples (1), (2) and (3) which have the different shape, are prepared and measured.

It can be seen from FIG. 7 that the very large fluctuation for each of product forms and measured products exists in the shear strength, there are many cases in which the shear strength is largely below 500 gf, and there is a problem that there are many frequencies in which insufficient strength is generated. Further, it can be seen from FIG. 8, that crazing and cracking generate at the high rate, which is a problem.

Figure 9:
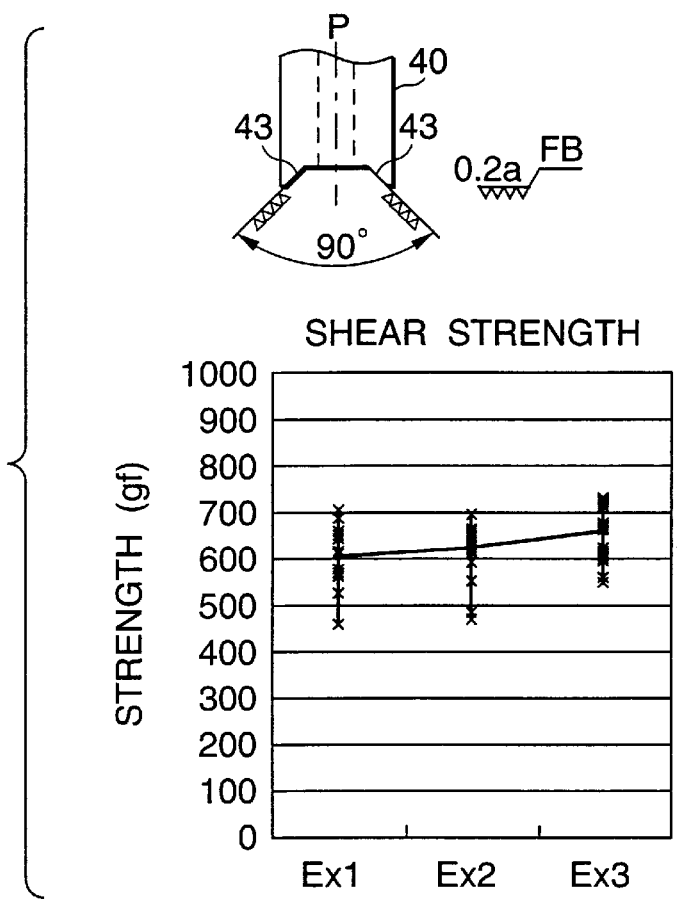
FIG. 9 is a graph showing the junction strength (shear strength) of a bump for each of product examples (1), (2) and (3) when a slant plane of the chip junction nozzle is a mirror surface.
Figure 10:
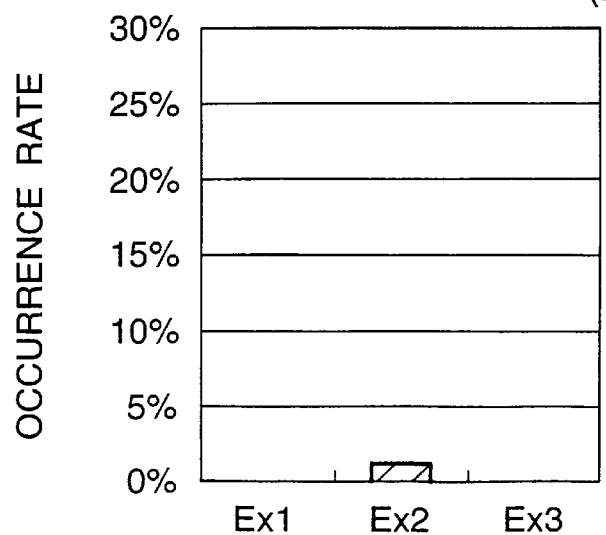
FIG. 10 is a graph showing a generation rate of crazing and cracking for each bump unit for each of product examples (1), (2) and (3) when a slant plane of the chip junction nozzle is a mirror surface.

FIG. 9 and FIG. 10 shows that the nozzle 40 whose slant plane 43 of the inclined angle 45° which is symmetrical to the nozzle center axis P, is mirror surface finishing processed (buff finishing) after the cutting work, is used, and when the surface roughness is expressed by the average roughness of the center line, the average roughness of the center line is about 0.2 $\mu$m. FIG. 9 shows the shear strength, and FIG. 10 shows the generation rate of crazing and cracking for each unit of bump. Further, measuring samples are the same as in FIG. 7 and FIG. 8.

It can be seen from FIG. 9 that the fluctuation of the shear strength is small over all measuring products of all product forms, and these assure the shear strength of more than 500 gf and the insufficient strength is not generated. Further, from FIG. 10, it is seen that there are no crazing and cracking in product examples (1) and (3), and there is no problem in these product forms.

Figure 22:
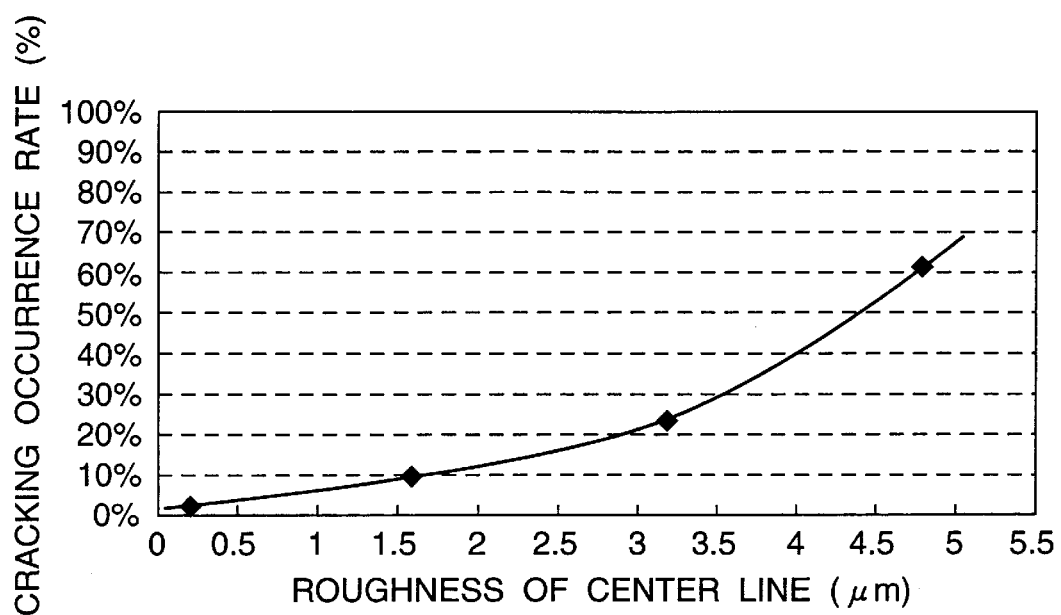
FIG. 22 shows a relationship between roughness of the mirror surface and cracking occurrence rate.

FIG. 22 shows a relationship between roughness of centerline and cracking occurrence rate, when the above-discussed example (2) is measured. As apparent from this graph, if the roughness of the center line are 0.2 $\mu$m, 1.6 $\mu$m, 3.2 $\mu$m, and 4.8 $\mu$m, the cracking occurrence rates are 2%, 10%, 23%, and 52%, respectively. If an acceptance of cracking occurrence rate is defined as less than 10%, the roughness of the center line is preferably less than 1.6 $\mu$m.

According to the first embodiment, the following effect can be obtained.

(1) The chip junction nozzle 40 has opposite mirror surface slant planes 43 contacting in parallel to edges of 2 sides of the chip 1 centering around the nozzle center, therefore, the edge of the chip 1 smoothly slides on the slant plane 43, and can change the posture of the chip 1. Accordingly, in face down mounting of the flip chip, when the chip 1 is jointed with the printed circuit board 30, the chip 1 can be always jointed in the situation that the chip 1 is parallel to the pattern 31 of the printed circuit board 30 to be jointed, thereby, mounting with uniform and strong junction strength can be carried out. Specifically, it is highly effective in the case of the ultrasonic junction.

(2) DLC surface treatment is conducted on the slant plane 43 which is mirror surface-worked, and the surface is made a hard surface whose surface hardness is more than HrC40, thereby, wear resistance can be assured and its life can be long.

(3) opposite slant planes 43 which are symmetrical to the nozzle center axis may be formed, and processing is easy.

(4) Both side surfaces of the recessed portion 44 in which slant planes 43 are formed, are opened without closely adhering to the chip 1, therefore, air can flow, the cooling effect is high, and the temperature rise of the chip 1 can be moderated. Further, the temperature change of the leading edge portion of the chip junction nozzle 40 can be small. Further, from the opened portion of side surface, parallelism between the chip 1 and the printed board 30, and a crushed amount of the bump can be monitored, and further, abnormality of the nozzle 40 or board 30 can also be monitored.

Figure 11:
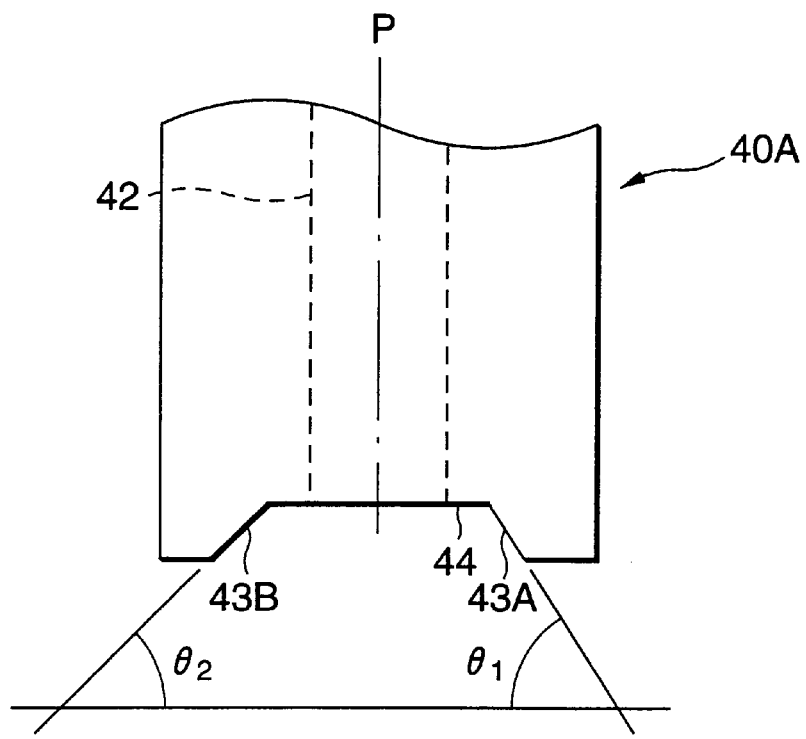
FIG. 11 is a front view showing the second embodiment of the present invention.

FIG. 11 shows the second embodiment of the present invention. In this case, a chip junction nozzle 40A forms opposite slant planes 43A and 43B which are asymmetrical to the nozzle center axis P. That is, an angle $\theta 1$ in which the slant plane 43A forms to the board surface (a plane vertical to the nozzle center axis), and an angle $\theta 2$ in which the slant plane 43B forms to the board surface, are different from each other, and $\theta 1 > \theta 2$. On the slant plane 43A of the angle $\theta 1$, the edge of the chip can slide more easily, and one side edge of the chip can be used as the reference.

Incidentally, the other structures are the same as those in the first embodiment, and the same or corresponding portion is denoted by the same code, and its explanation is omitted.

Figure 12:
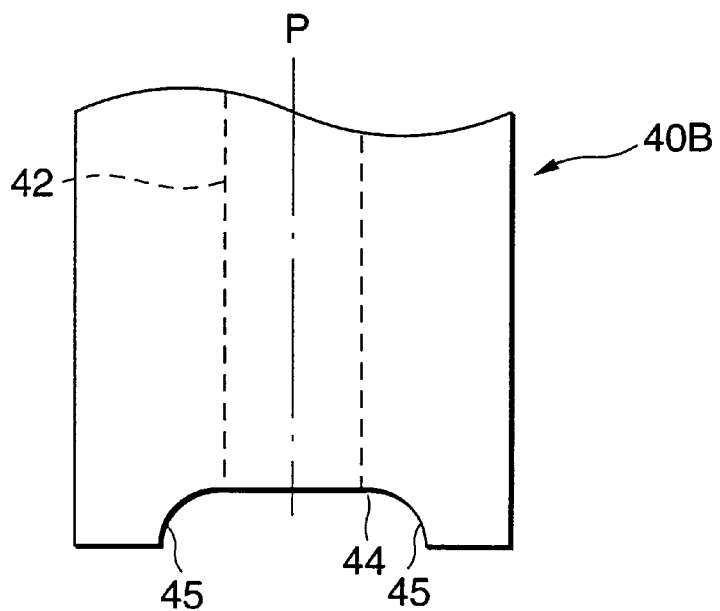
FIG. 12 is a front view showing the third embodiment of the present invention.

FIG. 12 shows the third embodiment of the present invention. In this case, a chip junction nozzle 40B forms opposite circular arc slopes 45 which are symmetrical to the nozzle center axis P. That is, the radius of curvature of the left and the right circular arc slopes 45 is set to be the same as each other. In this case, both circular arc slopes 45 function as slide surfaces of the chip edges. Further, because these are circular arc surfaces, the production is relatively easy.

Incidentally, the other structures are the same as those in the first embodiment, and the same or corresponding portion is denoted by the same code, and its explanation is omitted.

Figure 13:
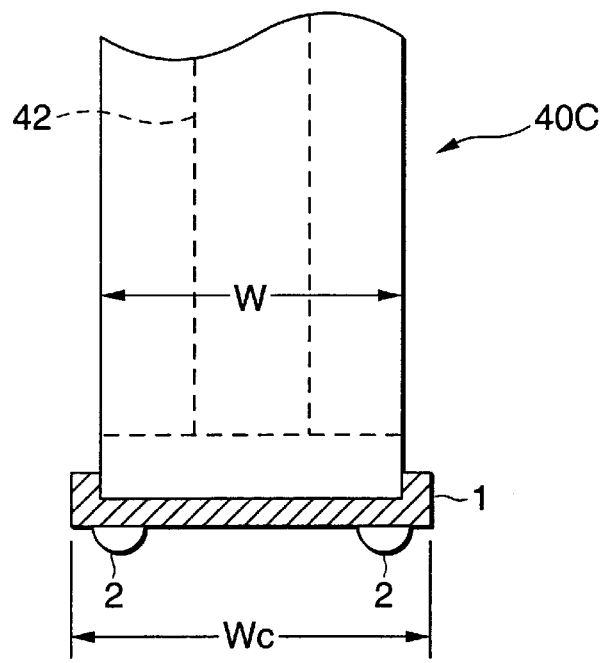
FIG. 13 is a side view showing the fourth embodiment of the present invention.
Figure 14:
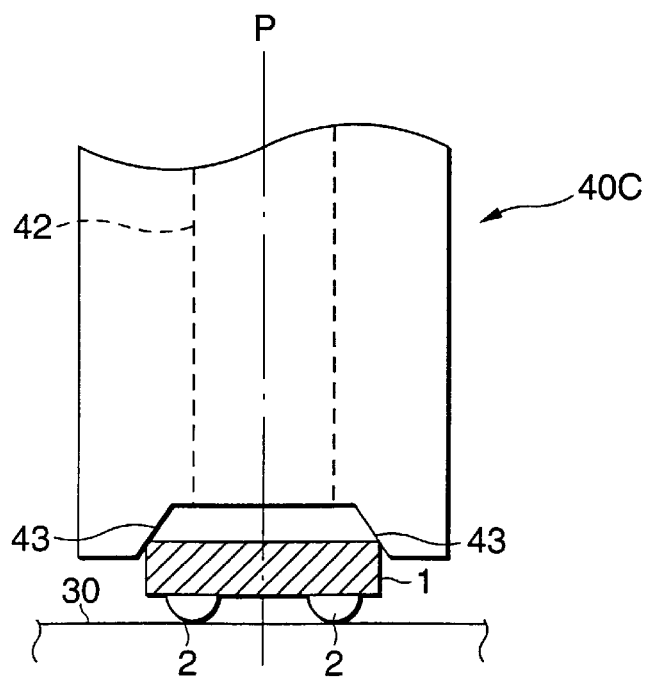
FIG. 14 is a front view showing the fourth embodiment of the present invention.

FIG. 13 and FIG. 14 show the forth embodiment of the present invention. In this case, the point that a chip junction nozzle 40C forms opposite slant planes 43 which are symmetrical to the nozzle center axis P, is the same as that in the first embodiment, however, the side surface width W of the chip junction nozzle 40C viewed from the side surface in FIG. 13 is narrower than the side surface width Wc of the chip 1.

In the case of this fourth embodiment, when chips 1 are arranged on the printed circuit boards and mounted, adjoining chips do not interfere with others, and it is appropriate for high-density mounting. Further, it is also excellent in the radiation effect, and the temperature rise of the chip 1 can be moderated. Incidentally, the other structures are the same as those in the first embodiment, and the same or corresponding portion is denoted by the same code, and its explanation is omitted.

Figure 15:
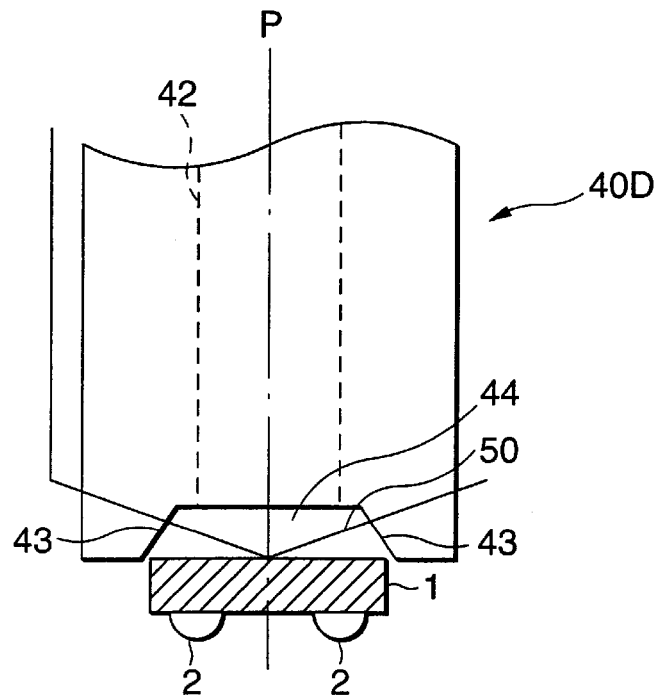
FIG. 15 is a front view at the time of the pick-up of the chip of the fifth embodiment of the present invention.
Figure 16:
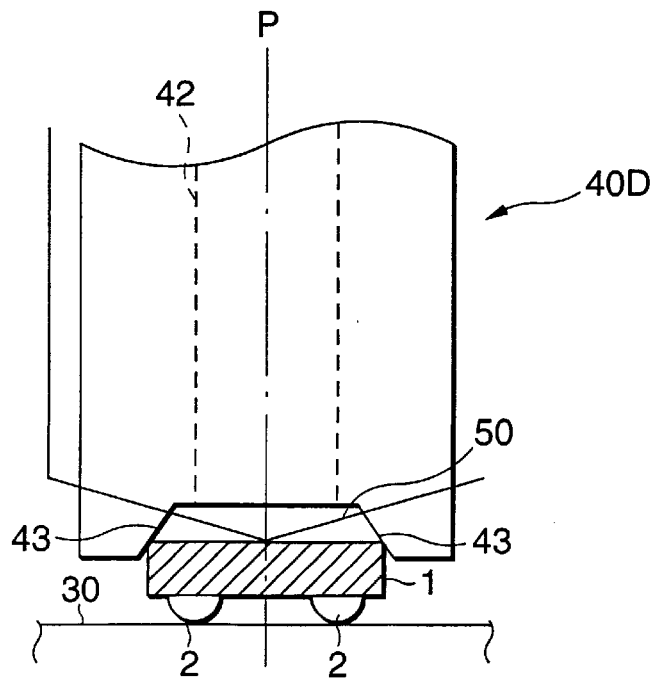
FIG. 16 is a front view at the time of the mounting of the chip of the fifth embodiment of the present invention.

FIG. 15 and FIG. 16 show the fifth embodiment of the present invention. In this case, the point that a chip junction nozzle 40D forms opposite slant planes 43 which are symmetrical to the nozzle center axis P, is the same as that in the first embodiment, however, a spring member 50 such as a leaf spring, or the like, is fixed onto the outer peripheral portion, and its lower portion extends in the recessed portion 44 by the opposite slant planes 43.

In this case, the spring member 50 urges the chip 1 toward the pushing down direction, thereby, when the chip 1 is mounted onto the pattern surface of the printed circuit board 30 as shown in FIG. 16, the friction between the chip 1 and the slant plane 43 is reduced, thereby, the edge of the chip 1 further smoothly slides and the posture of the chip 1 can be corrected. Incidentally, the other structures are the same as those in the first embodiment, and the same or corresponding portion is denoted by the same code, and its explanation is omitted.

Figure 17:
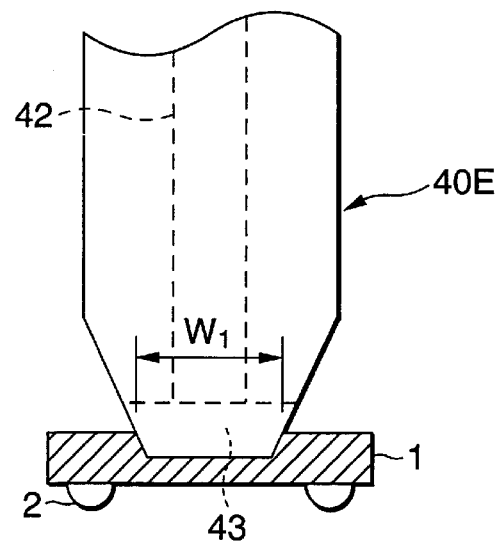
FIG. 17 is a side view showing the sixth embodiment of the present invention.
Figure 18:
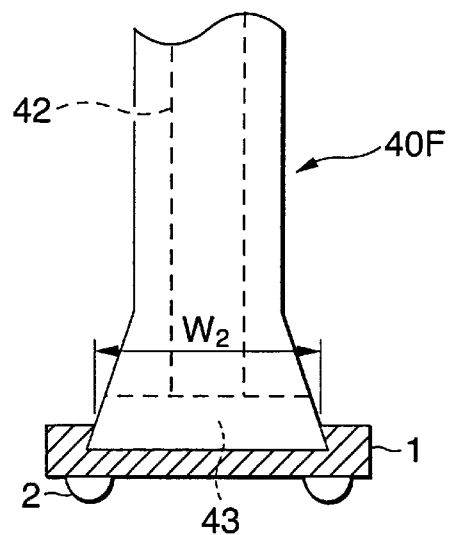
FIG. 18 is a side view showing the seventh embodiment of the present invention.
Figure 19:
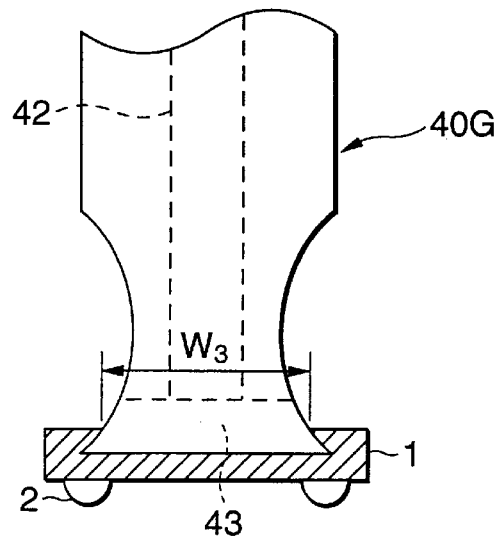
FIG. 19 is a side view showing the eighth embodiment of the present invention.
Figure 21:
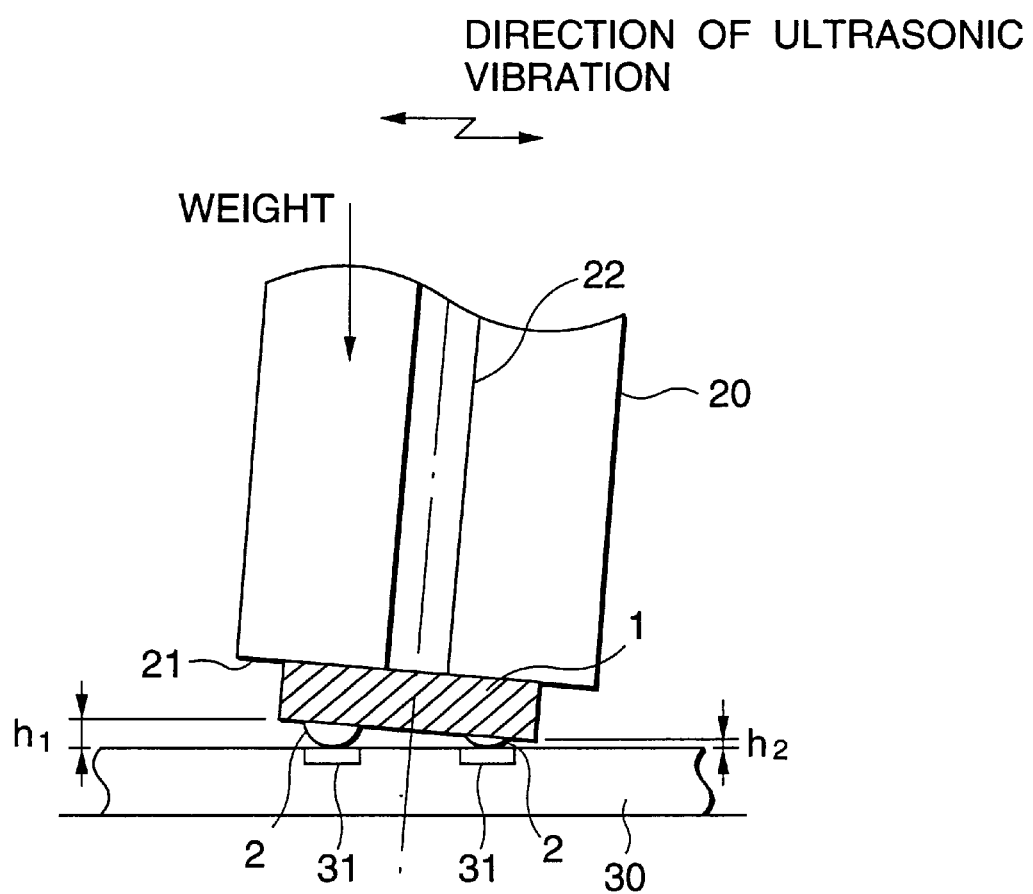
FIG. 21 is a front sectional view explaining the mounting operation when there is a slight deviation between a perpendicular of the pattern surface of the printed circuit board and the nozzle center axis of the conventional chip junction nozzle.

FIG. 17 through FIG. 19 respectively show the sixth, seventh and eighth embodiments of the present invention. In this case, the point that chip junction nozzles 40E, 40F, and 40G respectively form opposite slant planes 43 which are symmetrical to the nozzle center axis P, is the same as that in the first embodiment, however, the width of the chip junction nozzle viewed from the side surface is changed in the position of the height direction. According to this, the widths W1, W2, and W3 of the chip junction nozzles with which the edges of the chips come into contact, are respectively different, and impedance at the chip mounting viewed from the vibration apparatus which holds chip junction nozzle and generates ultrasonic, is changed, and impedance matching can be intended. Incidentally, the other structures are the same as those in the first embodiment, and the same or corresponding portion is denoted by the same code, and its explanation is omitted. That is, by changing the natural vibration frequency of the chip junction nozzle, the transmission of the vibration energy to the chip can be effectively conducted.

Incidentally, in the above first embodiment, the slope of the chip junction nozzle which is mirror finished, is formed into a slope having very high hardness by the DLC processing, however, it is not limited to the DLC processing, but when the slope is a nozzle material having the hardness more than HrC40, or surface treated, the wear resistance, which is enough in practical use, can be assured.

Further, in the above first embodiment, the surface roughness of the slope of the chip junction nozzle is made such that the center line average roughness is about 0.2 $\mu$m which is a very smooth mirror surface, however, when the surface roughness is made such that it is smoother than 1 rank as compared to the surface roughness when measured in FIG. 7 and FIG. 8, that is the center line average roughness is not more than 1.6 $\mu$m, the slope becomes practically mirror finishing, and the wear resistance between the edge of the chip and the slope can be enough reduced.

Embodiments of the present invention are described above, however, the present invention is not limited to this, but it will be clear to the skilled person that disclosed embodiments can be varied within claims by a skilled person without departing from the spirit and scope of the present invention.

As described above, according to the chip junction nozzle of the present invention, when the chip is jointed onto the printed circuit board in the face down mounting of the chip, the chip can be jointed in the situation that the chip is always parallel to the pattern of the printed circuit board to be jointed, thereby, mounting with the uniform and strong junction strength can be carried out.

This effect is effective for all the case where junction is carried out specifically by using the pressure as the junction element in mounting of the flip chip method, and the larger effect can be obtained when the ultrasonic is the junction element.

What is claimed is:

1. A chip junction nozzle system, comprising:

a chip;

mirror-finished slant surfaces, said slant surfaces configured with opposite slopes contacting in parallel edges of two sides of said chip and configured to center said chip around a nozzle center and to rotate said chip within said slant surfaces; and a vacuum suction hole opened at the nozzle center.

2. The chip junction nozzle system according to claim 1, wherein the hardness of the surface of the mirror surface is not less than HrC40.

3. The chip junction nozzle system according to claim 1, wherein, when the surface roughness of the mirror surface is expressed by the average roughness of the center line, the average roughness of the center line is not larger than 1.6 $\mu$m.

4. The chip junction nozzle system according to claim 1, wherein the slant surface comprises a plane or a circular arc surface.

5. An ultrasonic junction system, comprising:

a chip;

a nozzle;

an ultrasonic oscillator;

a horn which is connected to the oscillator, and onto whose leading edge the nozzle is attached; and a suction apparatus by which the chip is sucked into the nozzle, wherein said nozzle includes mirror-finished slant surfaces configured with opposite slopes contacting in parallel edges of two sides of the chip and configured to ultrasonically join the chip to a substrate and to center said chip around a nozzle center and to rotate said chip within said slant surfaces, and the vacuum suction hole opened at the nozzle center.

6. The ultrasonic junction system according to claim 5, wherein the hardness of the surface of the mirror surface is not less than HrC40.

7. The ultrasonic junction system according to claim 5, wherein, when the surface roughness of the mirror surface is expressed by the average roughness of the center line, the average roughness of the center line is not larger than 1.6 $\mu$m.

8. The ultrasonic junction system according to claim 5, wherein the slope is a plane or a circular arc surface.

* * * * *